(12) United States Patent
Peng (10) Patent No.: US 7,342,239 B2
(45) Date of Patent: Mar. 11, 2008

(54) ION IMPLANATION METHOD AND DEVICE USING THEREOF

(75) Inventor: Fu-Sheng Peng, Taoyuan County (TW)

(73) Assignee: United Microelectronics Corp., Hsinchu (TW)

( * ) Notice: Subject to any disclaimer, the term of this patent is extended or adjusted under 35 U.S.C. 154(b) by 289 days.

(21) Appl. No.: 11/164,537

(22) Filed: Nov. 29, 2005

(65) Prior Publication Data
US 2007/0120073 A1   May 31, 2007

(51) Int. Cl.
*H01J 37/317* (2006.01)
(52) U.S. Cl. ............................. 250/492.21; 250/492.2; 250/492.3; 250/423 R; 250/424
(58) Field of Classification Search ..................... None
See application file for complete search history.

(56) References Cited

U.S. PATENT DOCUMENTS 7,137,354 B2 * 11/2006 Collins et al. ......... 118/723 IR

* cited by examiner

*Primary Examiner*—Nikita Wells
(74) *Attorney, Agent, or Firm*—Jianq Chyun IP Office (57) ABSTRACT

An ion implantation method and device for forming an ion implantation area in a predetermined area of a substrate is provided. The method comprises the following steps. First, an ion beam is provided, then a first shape of cross-section and a first ion density distribution of the ion beam are detected. Then, a second shape of cross-section and a second ion density distribution of the ion beam are detected by moving the ion beam along a predetermined scanning path. Thereafter, the predetermined scanning path is adjusted and optimized according to the first shape of cross-section, the first ion density distribution, the second shape of cross-section and the second ion density distribution. Then, the ion beam is optimized along the optimized predetermined scanning path to form the ion implantation area in the predetermined area of the substrate.

19 Claims, 6 Drawing Sheets

ION IMPLANATION METHOD AND DEVICE USING THEREOF

BACKGROUND OF THE INVENTION

1. Field of the Invention

The present invention relates to an ion implantation method and a device using thereof. More particularly, the present invention relates to an ion implantation method and a device using thereof having an excellent uniformity of implantation.

2. Description of Related Art

In the manufacturing process of semiconductor device, in order to obtain a predetermined conductivity, it is usually to add impurity to the film layer of the device, wherein the process is general called doping or implantation process and the impurity is called a dopant. The conventional doping method may be generally classified into diffusion method and ion implantation method. In general, the diffusion method is also called thermal diffusion method since the process is performed by the diffusion of the dopant in the host material from high dopant concentration area to low dopant concentration area under high temperature (generally about 800° C.). However, the ion implantation method is performed by accelerating and implanting the ionized dopant to dope the dopant into the host material directly.

Figure 1:
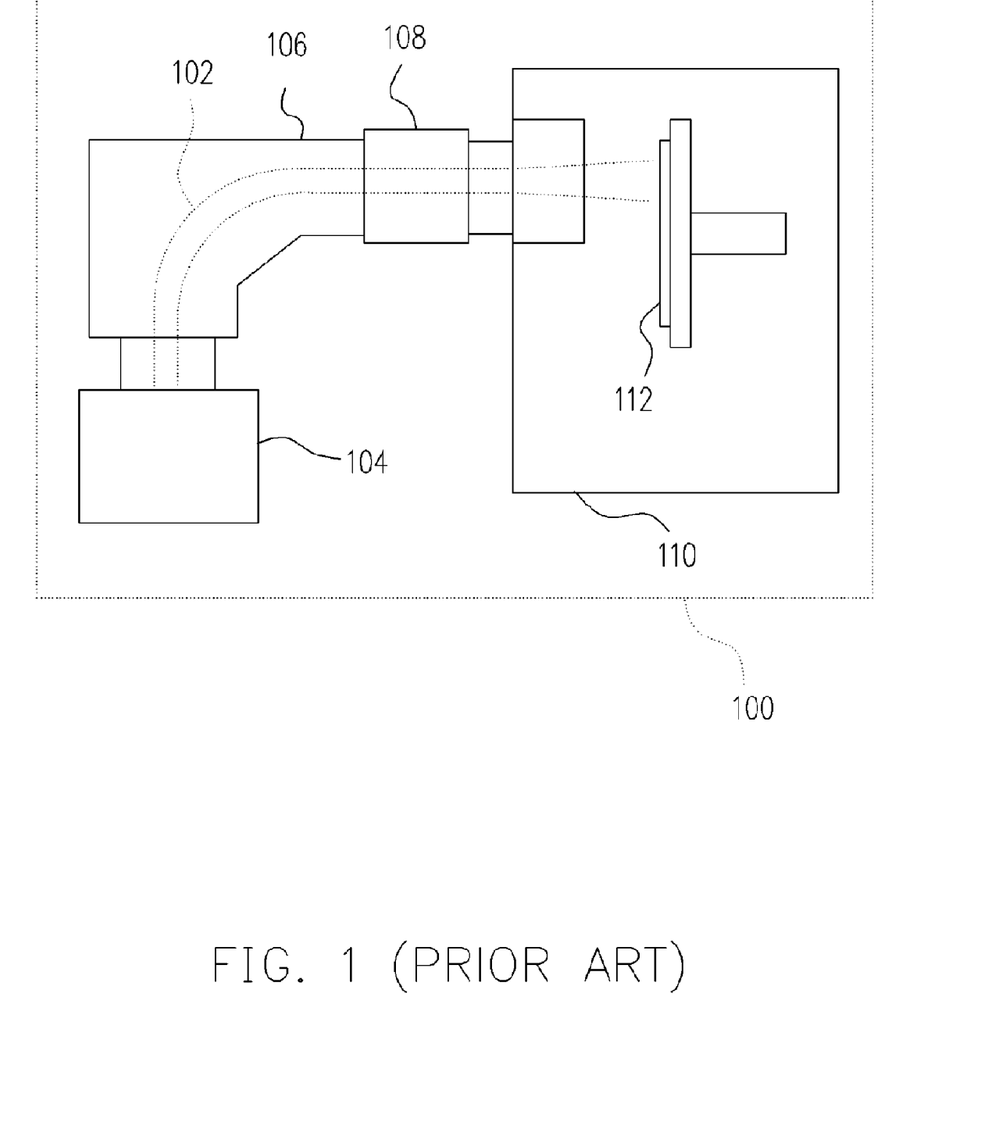
FIG. 1 is a schematic cross-sectional view illustrating a conventional ion implanter.

FIG. 1 is a schematic cross-sectional view illustrating a conventional ion implanter. In general, the structure of a conventional ion implanter is quite complex. Referring to FIG. 1, the ion implanter 100 substantially comprises ion beam 102, ion source 104, mass analyzer 106, accelerator 108 and scanner 110. The ion source is used for generating the ion beam 102, and the mass analyzer 106 is used to separate and select a portion of the ion beam 102 to be used as the dopant. The accelerator 108 is used for accelerating the ion beam 102, and the scanner 110 is used for scanning the wafer 112 by the ion beam 102. Hereinafter, the problem generated in the conventional ion implanter will be discussed.

Figure 2:
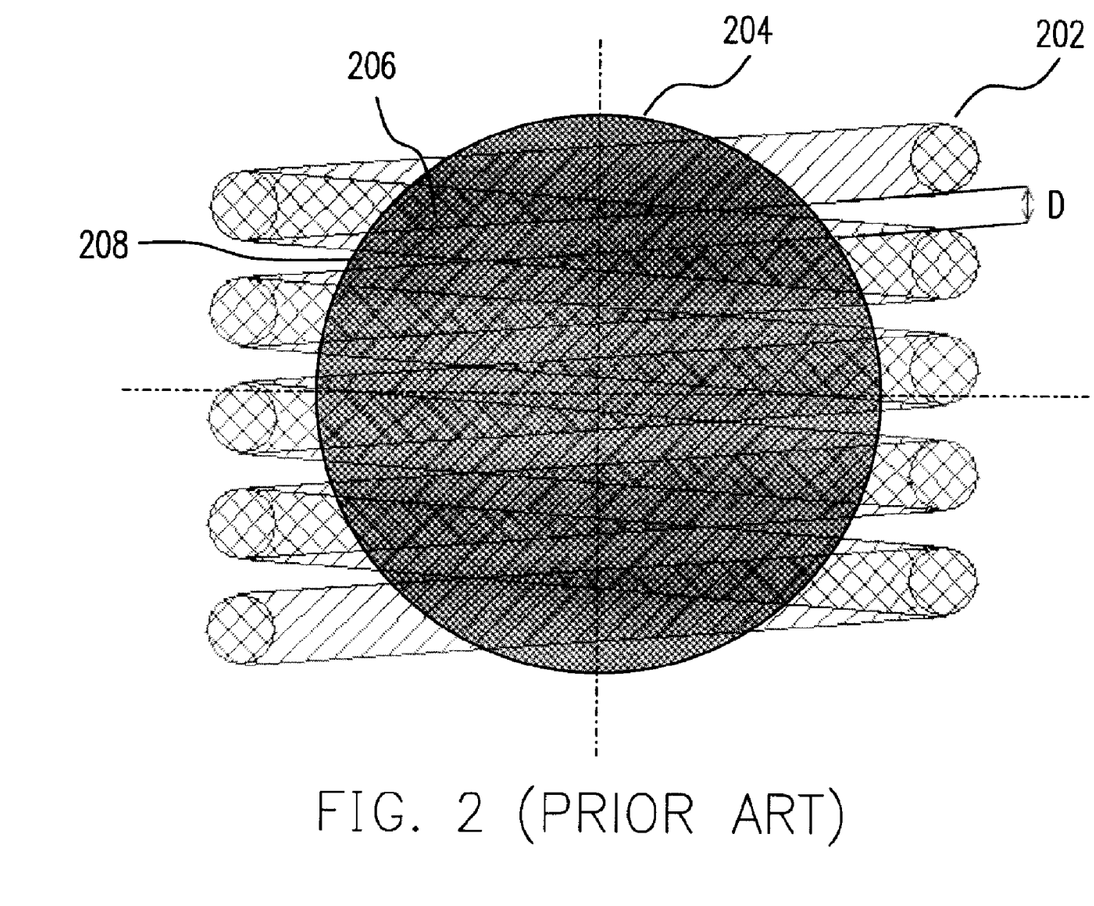
FIG. 2 is a top view schematically illustrating the method of scanning a wafer in a conventional ion implanter.

FIG. 2 is a top view schematically illustrating the method of scanning a wafer in a conventional ion implanter. As shown in FIG. 2, the ion beam is enlarged before the ion beam 102 is scanned over the wafer 204. Therefore, an ion beam area 202 is achieved. The size of the ion beam area 202 is adjusted in comparison with the size of the wafer 204, and the ion beam 202 is scanned along a scan path such as the zigzag path shown in FIG. 2 to be implanted in the whole area of the wafer 204. However, as shown in FIG. 2, in the conventional scan process, a portion of the wafer 204, for example, the area 206 is scanned at least twice. Alternatively, another portion of the wafer 204, for example, the area 208 is not scanned.

In order to solve the problem described above, conventionally the speed or frequency of scanning process is fixed to enhance the scan uniformity. Alternatively, the scanning speed is dependent on the ion beam current. Sometimes the times of scanning process are also increased. However, the improvement of the uniformity is not obvious. Alternatively, the thermal diffusion method is also adopted to improve the scan uniformity. However, the thermal budget of the whole process is increased, therefore the cost and process time are also increased.

In addition, when the ion beam is enlarged during the scanning process over the wafer to obtain the ion beam area 202, in general the ion concentration distribution on the ion beam area 202 is not uniform. Especially, the ions are mutually repelled since the ions in the ion beam have the same charges. Therefore, the ion beam is broad up during the scanning process, thus the shape of the ion beam is changed and the ion concentration distribution on the cross-section of the ion beam is not uniform. Therefore, the size, the shape and the ion concentration distribution of the ion beam area 202 has to be adjusted frequently during the scanning process.

Moreover, during the ion beam is implanted to the wafer and after the ion beam area 202 is formed, since the implanted ions are positively charged, the surface of the wafer are also positively charged. Therefore, the ion beam and the surface of the wafer are mutually repelled, and thus the position, size, shape and ion concentration distribution of the ion beam area 202 formed in the later implantation process. In general, the problem may be solved by applying an electron beam to the surface of the wafer to electricity neutralize the surface of the wafer. The electron beam is generated, for example, during the ionization of the ion beam. However, the influence of the implantation of the electron beam on the surface of the wafer has to be noted.

Accordingly, a method and device for effectively increase the uniformity of ion implantation process is quite desirable.

SUMMARY OF THE INVENTION

Therefore, the present invention is directed to an ion implantation method for improving the uniformity of the ion implantation.

In addition, the present invention is directed to an ion implantation method for improving the uniformity of the ion implantation.

According to one embodiment of the present invention, an ion implantation method for forming an ion implantation area in a predetermined area of a substrate is provided. The method comprises, for example but not limited to, the following steps. First, an ion beam is provided, then a first shape of cross-section and a first ion density distribution of the ion beam are detected. Then, a second shape of cross-section and a second ion density distribution of the ion beam are detected by moving the ion beam along a predetermined scanning path. Thereafter, the predetermined scanning path is adjusted and optimized according to the first shape of cross-section, the first ion density distribution, the second shape of cross-section and the second ion density distribution. Then, the ion beam is optimized along the optimized predetermined scanning path to form the ion implantation area in the predetermined area of the substrate.

In one embodiment of the present invention, the method further comprises providing an electron beam and detecting a shape of cross-section and an electron density distribution of the electron beam.

In one embodiment of the present invention, a method of adjusting the predetermined scanning path comprises arranging a path for scanning the ion beam, adjusting a scanning speed of the ion beam, adjusting an interval of a path for scanning the ion beam, adjusting a cross-section of the ion beam or a method mixed thereof.

In one embodiment of the present invention, a method of detecting the first shape of cross-section, the first ion density distribution, the second shape of cross-section and the second ion density distribution is performed by an optical sensor device and/or an electrical sensor device. Furthermore, the optical sensor device comprises a fluorescence sensor screen. In addition, the electrical sensor device comprises a faraday cup.

According to one embodiment of the present invention, an ion implantation device is provided. The device comprises, for example but not limited to, an ion source, a scan device, a detection device, and a scan device controller. The ion source is used for generating an ion beam, and the scan device is disposed after the ion source for scanning the ion beam. The detection device is used for detecting the ion beam to obtain an ion beam condition, and the scan device controller is used for controlling the scan device according to the ion beam condition.

In one embodiment of the present invention, the detection device is disposed near an area of an implantation of the ion beam.

In one embodiment of the present invention, the detection device is disposed along a predetermined scanning path of an implantation of the ion beam.

In one embodiment of the present invention, the ion beam condition comprises a shape of cross-section and/or an ion density distribution of the ion beam.

In one embodiment of the present invention, the device further comprises an electron beam source for generate an electron beam. In addition, the detection device may be used for detecting an electron beam condition of the electron beam, and thus the electron beam is controlled by the scan device controller according to the electron beam condition.

In one embodiment of the present invention, the detection device comprises an optical sensor device and/or an electrical sensor device. Furthermore, the optical sensor device comprises a fluorescence sensor screen. In addition, the electrical sensor device comprises a faraday cup.

Accordingly, in the ion implantation device and method of the present invention, the detection device and the scan device controller are provided for detecting the ion beam condition such as the ion density and the shape of cross-section of the ion beam. In addition, a predetermined scanning path is adjusted and optimized according to the ion beam condition. Therefore, an excellent ion density distribution is obtained when the ion implantation process is performed.

It is to be understood that both the foregoing general description and the following detailed description are exemplary, and are intended to provide further explanation of the invention as claimed.

BRIEF DESCRIPTION OF THE DRAWINGS

The accompanying drawings are included to provide a further understanding of the invention, and are incorporated in and constitute a part of this specification. The following drawings illustrate embodiments of the invention and, together with the description, serve to explain the principles of the invention.

DESCRIPTION OF THE EMBODIMENTS

The present invention now will be described more fully hereinafter with reference to the accompanying drawings, in which preferred embodiments of the invention are shown. This invention may, however, be embodied in many different forms and should not be construed as limited to the embodiments set forth herein; rather, these embodiments are provided so that this disclosure will be thorough and complete, and will fully convey the scope of the invention to those skilled in the art. Like numbers refer to like elements throughout.

Figure 3:
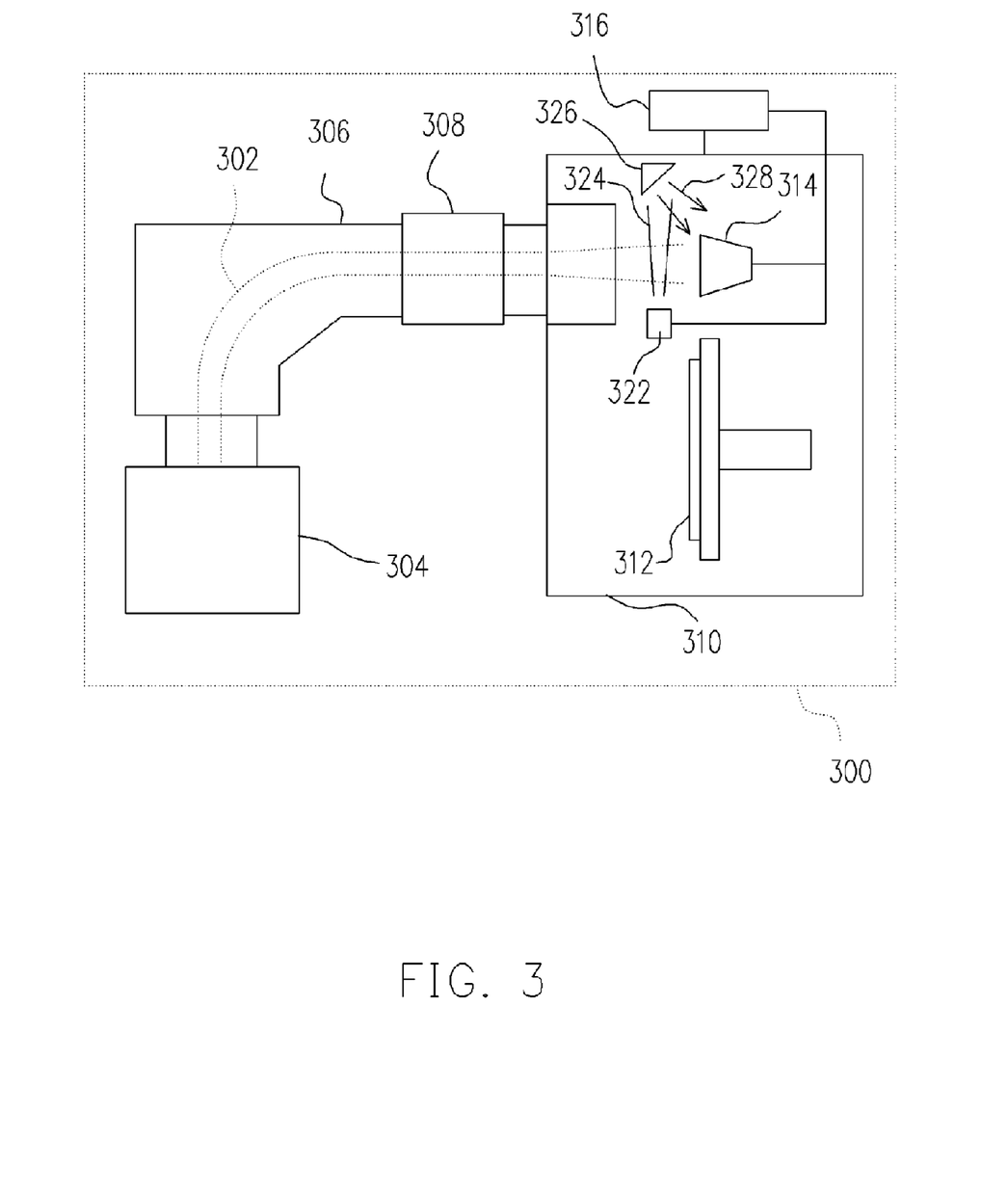
FIG. 3 is a schematic cross-sectional view illustrating an ion implantation device according to one embodiment of the present invention.

It should be noted that the ion implantation device of the present invention is compatible with any conventional ion implantation device by incorporating the detection device and the scan device controller of the invention with the conventional ion implantation device. FIG. 3 is a schematic cross-sectional view illustrating an ion implantation device according to one embodiment of the present invention. Referring to FIG. 3, ion implantation device 300 comprises, for example but not limited to, an ion source 304, a mass analyzer 306, an accelerator 308, a scan device 310, a detection device 314 and a scan device controller 316. In addition, the ion implantation device 300 may optionally comprise, for example but not limited to, an electron generator comprising a first electron generator 322 and a second electron generator 324. The ion source 304 is provided for generating the ion beam 302. The mass analyzer 306 is provided for separating and selecting a portion of the ion beam 302 to be used as the dopant. The accelerator 308 is provided for accelerating the ion beam 302. The scan device 310 is used for scanning the wafer 312 by using the ion beam 302.

In addition, the scan device controller 316 is connected to the detection device 314 for receiving the detected ion beam condition. The scan device 310 is controlled by the scan device controller 316 according to the detected ion beam condition. The detection device 314 comprises, for example but not limited to, an optical sensor device or an electrical sensor device. The optical sensor device comprises, for example but not limited to, a fluorescence sensor screen. The electrical sensor device comprises, for example but not limited to, at least a faraday cup. The fluorescence sensor screen can be used to detect the ion density and the shape of the cross-section of the ion beam since a light is emitted by the fluorescence sensor screen after the screen is impacted by the ion beam. In addition, the higher the ion density, the higher the brightness of the light emitted.

Figure 4:
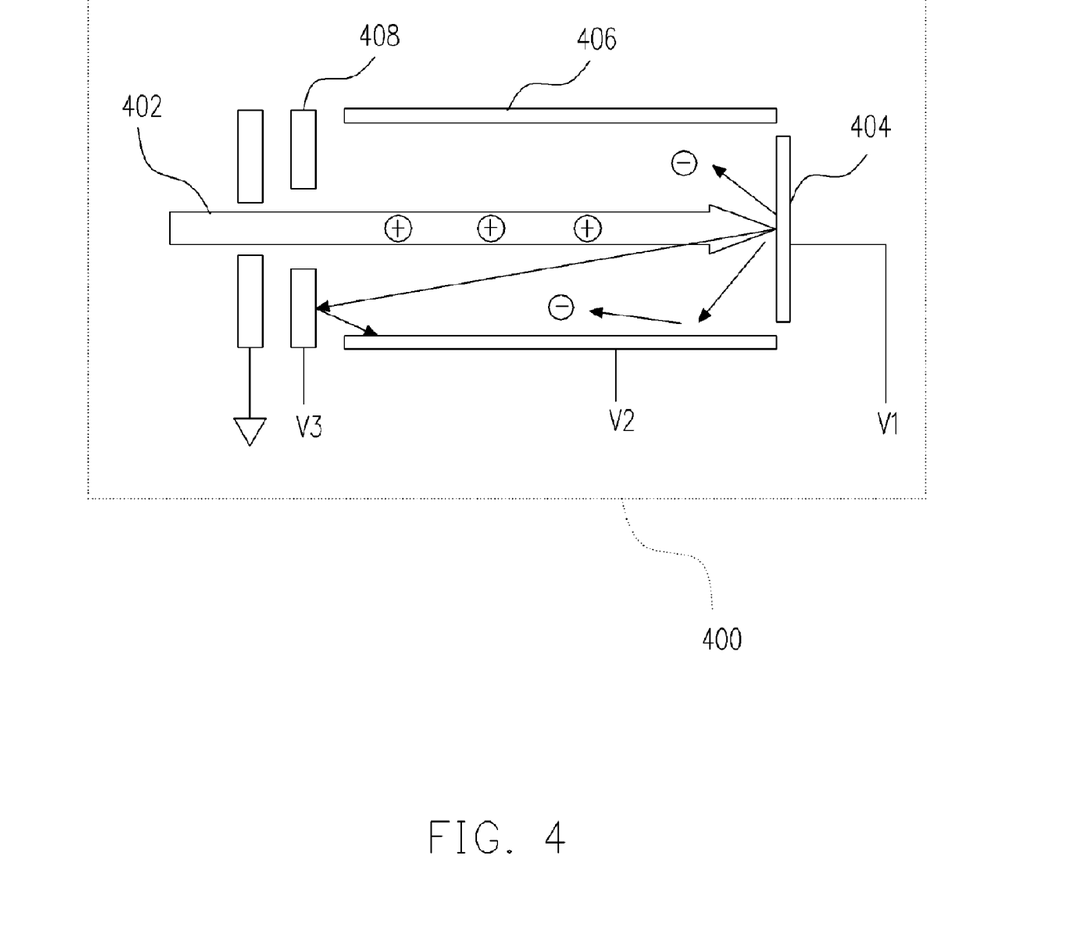
FIG. 4 is a schematic cross-sectional view illustrating a faraday cup according to one embodiment of the present invention.

FIG. 4 is a schematic cross-sectional view illustrating a faraday cup according to one embodiment of the present invention. In one embodiment of the present invention, the electrical sensor device comprises, for example but not limited to, a single faraday cup only or comprises a plurality of faraday cup arranged in a honeycomb structure or an array structure. Referring to FIG. 4, electrons are generated during the wall 404 of the faraday cup 400 is impacted by the ion beam 402, or during the wall 406 or wall 408 of the faraday cup 400 is impacted by the reflected ion beam 402. It is noted that the number of the generated electrons is proportional to the number of the ion beam, therefore the ion density and the shape of the cross-section of the ion beam can be detected.

Optionally, in order to neutralize the positive charge on the surface of the wafer during the implantation of the ion beam, an electron beam is performed to the surface of the wafer. In one embodiment of the present invention, the electron beam may be generated, for example, during the ionization of the ion beam or by an electron generator. As shown in FIG. 3, an electron generator comprising a first electron generator 322 and a second electron generator 324 is provided. The first electron generator 322 comprises, for example but not limited to, a filament for generating a plurality of primary electrons 326 by add current to the filament. The second electron generator 324 comprises, for example but not limited to, a metal target. Therefore, a plurality of secondary electrons may be generated as the metal target is hit by the primary electrons 328. The secondary electrons will diffuse to the surface of the wafer, thus the positive charges on the surface of the wafer are neutralized.

In one embodiment of the present invention, the detection device 314 is disposed near an area of an implantation of the ion beam, for example but not limited to, the area near the detection device 314 is disposed as shown in FIG. 3. In another embodiment of the present invention, detection device 314 is disposed along a predetermined scanning path of an implantation of the ion beam, for example but not limited to, along a direction parallel to the surface of the wafer 312 as shown in FIG. 3. In addition, the detection device 314 may be moved along the direction described above. Therefore, when the ion beam 302 is scanned along the predetermined scanning path, the ion density and shape of the cross-section of the ion beam 302 along the predetermined scanning path are detected by the detection device 314. Thus, the ion density distribution and uniformity of the ion beam 302 along the whole predetermined scanning path can be obtained. In one embodiment of the present invention, the shape of the cross-section and the electron density distribution of the secondary electrons 328 may also be detected by the detection device 314. The first electron generator 322 is connected to the scan device controller 316, therefore, the first electron generator 322 may also be controlled by the scan device controller 316 according to the detected shape of the cross-section and the electron density distribution of the secondary electrons 328.

Figure 5:
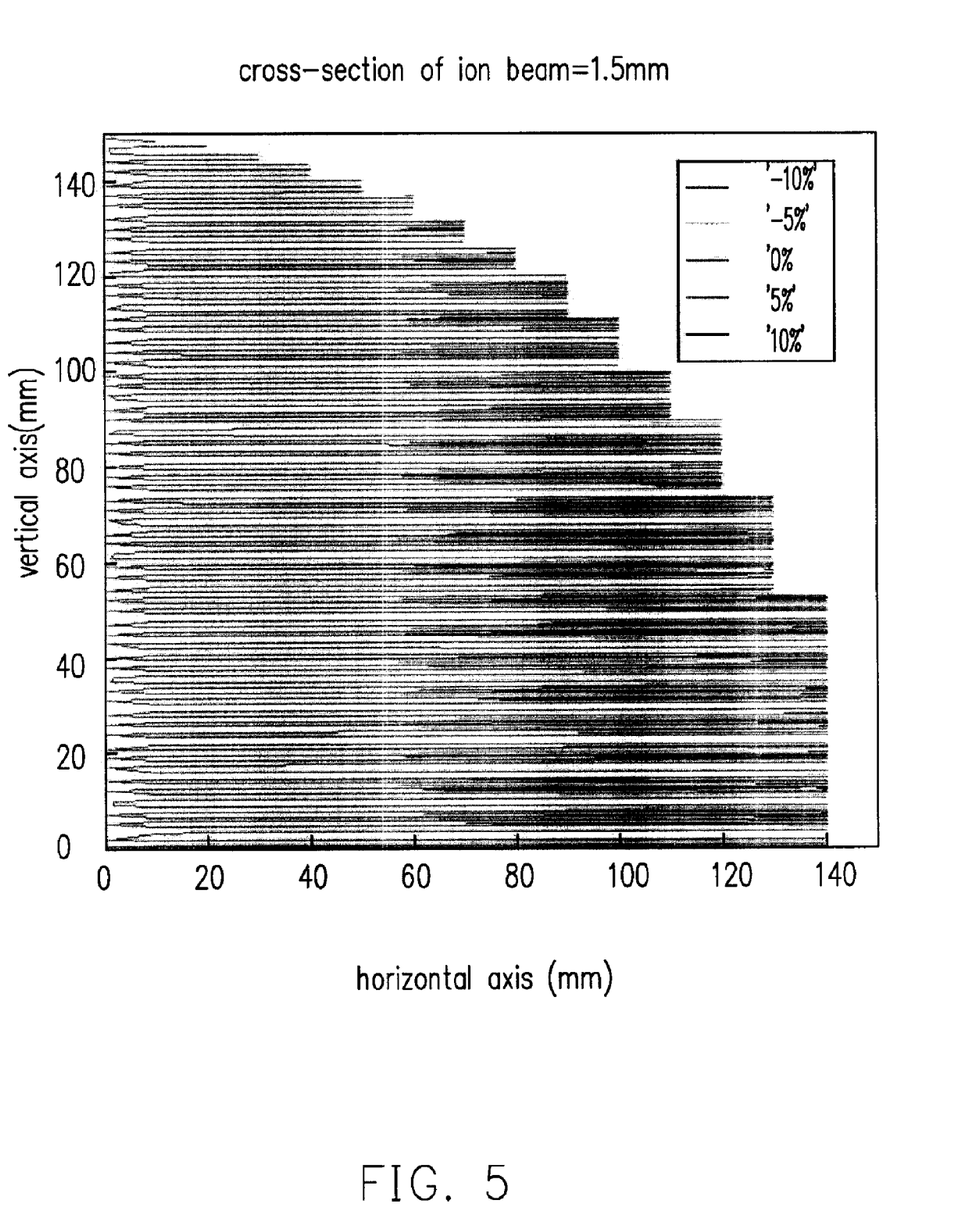
FIG. 5 is a drawing illustrating an ion density distribution of an ion beam in a predetermined area after a scan according to one embodiment of the present invention.

FIG. 5 is a drawing illustrating an ion density distribution of an ion beam in a predetermined area after a scan according to one embodiment of the present invention. Referring to FIG. 5, in one embodiment of the present invention, a scanning is performed by setting the diameter of the cross-section of the ion beam to be about 1.5 mm and the using the scanning path as shown in FIG. 2 with fixed scanning speed and frequency. In other words, the diameter of the ion beam area 202 shown in FIG. 2 is set to be about 1.5 mm to obtain the drawing of ion density distribution shown in FIG. 5. The percentage value shown in FIG. 5 represents the relative ratio of ion density of the position. It is noted that, in the horizontal direction of the drawing of the ion density distribution, the ion density distribution near the edge is less uniform than that near the center.

Figure 6:
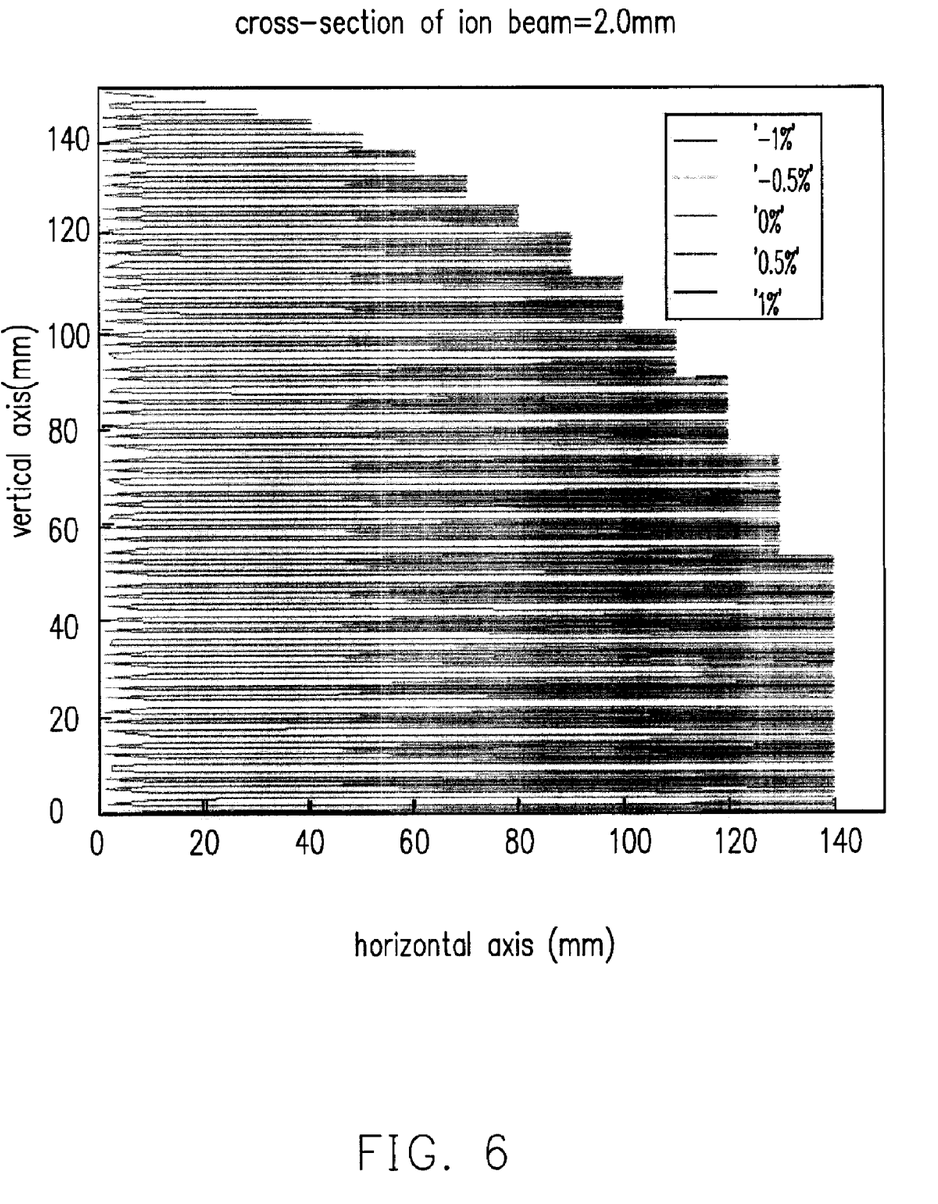
FIG. 6 is a drawing illustrating an ion density distribution of an ion beam in a predetermined area after a scan according to one embodiment of the present invention.

FIG. 6 is a drawing illustrating an ion density distribution of an ion beam in a predetermined area after a scan according to one embodiment of the present invention. Referring to FIG. 6, in one embodiment of the present invention, a scanning is performed by setting the diameter of the cross-section of the ion beam to be about 2.0 mm and the using the scanning path as shown in FIG. 2 with fixed scanning speed and frequency. In other words, the diameter of the ion beam area 202 shown in FIG. 2 is set to be about 2.0 mm to obtain the drawing of ion density distribution shown in FIG. 6. In comparison with FIG. 5, ion density distribution of FIG. 6 is more uniform. Therefore, in one embodiment of the present invention, the ion density distribution of the ion implantation may be adjusted and optimized by adjusting the path of scanning the ion beam (e.g., the zigzag path shown in FIG. 2), the scanning speed, the interval between the path of scanning the ion beam (e.g., the distance D between the zigzag path shown in FIG. 2), or the cross-section of the ion beam (e.g., the ion beam area 202 shown in FIG. 2). Therefore, in the present invention, an excellent ion density distribution is obtained.

In one embodiment of the present invention, an ion density distribution may be detected by scanning the ion beam along a predetermined scanning path, thereafter the predetermined scanning path may be optimized. Then, the wafer or the semiconductor device to be implanted may be loaded into the scan device 310 as shown in FIG. 3 to perform the ion implantation process.

It is noted that, the ion implantation device of the present invention is not limited to the embodiments of the invention. In other words, any conventional device that can be used for ion implantation can be incorporated with, for example but not limited to, the detection device and scan device controller to perform the implantation process of the present invention.

Accordingly, in the ion implantation device and method of the present invention, the detection device and the scan device controller are provided for detecting the ion beam condition such as the ion density and the shape of cross-section of the ion beam. In addition, a predetermined scanning path is adjusted and optimized according to the ion beam condition. Therefore, an excellent ion density distribution is obtained when the ion implantation process is performed.

It will be apparent to those skilled in the art that various modifications and variations can be made to the structure of the present invention without departing from the scope or spirit of the invention. In view of the foregoing, it is intended that the present invention cover modifications and variations of this invention provided they fall within the scope of the following claims and their equivalents.

What is claimed is:

1. An ion implantation method, for forming an ion implantation area in a predetermined area of a substrate, the ion implantation method comprising:

providing an ion beam, and detecting a first shape of cross-section and a first ion density distribution of the ion beam;

moving the ion beam along a predetermined scanning path, and detecting a second shape of cross-section and a second ion density distribution of the ion beam;

adjusting the predetermined scanning path according to the first shape of cross-section, the first ion density distribution, the second shape of cross-section and the second ion density distribution to optimize the predetermined scanning path; and implanting the ion beam along the optimized predetermined scanning path to form the ion implantation area in the predetermined area of the substrate.

2. The method of claim 1, further comprises:

providing an electron beam; and detecting a shape of cross-section and an electron density distribution of the electron beam.

3. The method of claim 1, wherein a method of adjusting the predetermined scanning path comprises arranging a path for scanning the ion beam.

4. The method of claim 1, wherein a method of adjusting the predetermined scanning path comprises adjusting a scanning speed of the ion beam.

5. The method of claim 1, wherein a method of adjusting the predetermined scanning path comprises adjusting an interval of a path for scanning the ion beam.

6. The method of claim 1, wherein a method of adjusting the predetermined scanning path comprises adjusting a cross-section of the ion beam.

7. The method of claim 1, wherein a method of detecting the first shape of cross-section, the first ion density distribution, the second shape of cross-section and the second ion density distribution is performed by an optical sensor device.

8. The method of claim 7, wherein the optical sensor device comprises a fluorescence sensor screen.

9. The method of claim 1, wherein a method of detecting the first shape of cross-section, the first ion density distribution, the second shape of cross-section and the second ion density distribution is performed by an electrical sensor device.

10. The method of claim 9, wherein the electrical sensor device comprises a faraday cup.

11. An ion implantation device, comprising:
   an ion source, for generating an ion beam;
   a scan device, disposed after the ion source for scanning the ion beam;
   a detection device, for detecting the ion beam to obtain an ion beam condition; and a first shape of cross-section and a first ion density distribution of the ion beam; and
   a scan device controller, for controlling the scan device according to the ion beam condition wherein, the ion beam moves along a predetermined scanning path, and the detection device detects a second shape of cross-section and a second ion density distribution of the ion beam; adjusting the predetermined scanning path according to the first shape of cross-section, the first ion density distribution, the second shape of cross-section and the second ion density distribution to optimize the predetermined scanning path.

12. The device of claim 11, wherein the detection device is disposed near an area of an implantation of the ion beam.

13. The device of claim 11, wherein the detection device is disposed along a predetermined scanning path of an implantation of the ion beam.

14. The device of claim 11, wherein the ion beam condition comprises a shape of cross-section and/or an ion density distribution of the ion beam.

15. The device of claim 11, further comprises:
   an electron beam source, for generate an electron beam, wherein the detection device is used for detecting an electron beam condition of the electron beam, and the electron beam is controlled by the scan device controller according to the electron beam condition.

16. The device of claim 11, wherein the detection device comprises an optical sensor device.

17. The device of claim 16, wherein the optical sensor device comprises a fluorescence sensor screen.

18. The device of claim 11, wherein the detection device comprises an electrical sensor device.

19. The device of claim 18, wherein the electrical sensor device comprises a faraday cup.

* * * * *